(12) United States Patent
Tung et al.

(10) Patent No.: US 12,476,187 B2
(45) Date of Patent: Nov. 18, 2025

(54) METHOD AND STRUCTURE FOR METAL TRACKS IN SEMICONDUCTOR DEVICES

(71) Applicant: Taiwan Semiconductor Manufacturing Company, Ltd., Hsinchu (TW)

(72) Inventors: Yu-Lung Tung, Kaohsiung (TW); Xiaodong Wang, Hsinchu (TW); Jhon Jhy Liaw, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 787 days.

(21) Appl. No.: 17/690,595

(22) Filed: Mar. 9, 2022

(65) Prior Publication Data
US 2023/0207457 A1 Jun. 29, 2023

Related U.S. Application Data

(60) Provisional application No. 63/294,207, filed on Dec. 28, 2021.

(51) Int. Cl.
*H01L 23/528* (2006.01)
*H10D 84/83* (2025.01)
*H10D 84/85* (2025.01)

(52) U.S. Cl.
CPC ......... *H01L 23/528* (2013.01); *H10D 84/834* (2025.01); *H10D 84/853* (2025.01)

(58) Field of Classification Search
CPC ............... H01L 23/528; H01L 27/0886; H01L 27/0924
See application file for complete search history.

(56) References Cited

U.S. PATENT DOCUMENTS

| | | | |
|---|---|---|---|
| 9,009,639 B2 | 4/2015 | Lee et al. | |
| 9,195,134 B2 | 11/2015 | Huang et al. | |
| 9,257,439 B2 | 2/2016 | Liaw | |
| 9,818,694 B2 | 11/2017 | Lin et al. | |
| 10,971,630 B2 | 4/2021 | Liaw | |
| 2013/0154027 A1* | 6/2013 | Liaw | H10D 89/10 |
| | | | 257/E27.06 |
| 2015/0243667 A1* | 8/2015 | Liaw | H10B 10/18 |
| | | | 716/110 |

(Continued)

*Primary Examiner* — Christine A Enad
(74) *Attorney, Agent, or Firm* — HAYNES AND BOONE, LLP

(57) ABSTRACT

A structure includes first and second cells next to each other and having first and second cell heights, respectively, along a column direction. Each cell includes at least one semiconductor active region extending lengthwise along a row direction perpendicular to the column direction. The structure further includes an array of metal tracks over the first and second cells. The metal tracks are formed by a photolithography process having a half-pitch resolution $R_{row}$ in the row direction. A first pitch of the metal tracks along the row direction is greater than or equal to $2R_{row}$. At least three rows of the metal tracks are in an area that is directly above the first and second cells and has a height equal to a sum of the first and second cell heights. A row of the metal tracks is disposed across a cell boundary of the first and second cells.

20 Claims, 10 Drawing Sheets

(56) References Cited

U.S. PATENT DOCUMENTS

| | | |
|---|---|---|
| 2016/0064067 A1 | 3/2016 | Mojumder et al. |
| 2019/0326300 A1 | 10/2019 | Liaw |
| 2020/0411500 A1 | 12/2020 | Holland et al. |
| 2021/0064806 A1* | 3/2021 | Peng ..................... H01L 23/528 |
| 2021/0173999 A1* | 6/2021 | Lefferts ................ G06F 30/367 |
| 2021/0286927 A1* | 9/2021 | Sio ........................ G06F 30/394 |

* cited by examiner

METHOD AND STRUCTURE FOR METAL TRACKS IN SEMICONDUCTOR DEVICES

PRIORITY

This claims the benefits and priority to U.S. Provisional Application No. 63/294,207 filed Dec. 28, 2021, the disclosure of which is incorporated herein by reference.

BACKGROUND

The semiconductor integrated circuit (IC) industry has experienced rapid growth. During IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, ICs typically use a multi-level interconnect to connect individual devices (e.g., transistors) on a chip. The multi-level interconnect includes metal tracks (or metal lines) and metal vias. In designing these metal tracks, some approaches focus on directly shrinking the metal pitch (the interval at which the metal tracks repeat along their widthwise direction) in order to meet the area budget. However, small metal pitches make it difficult for photolithography processes, and thus require double patterning or multi-patterning processes. Consequently, such approaches may increase process complexity and process costs. Improvements in metal track designs are desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
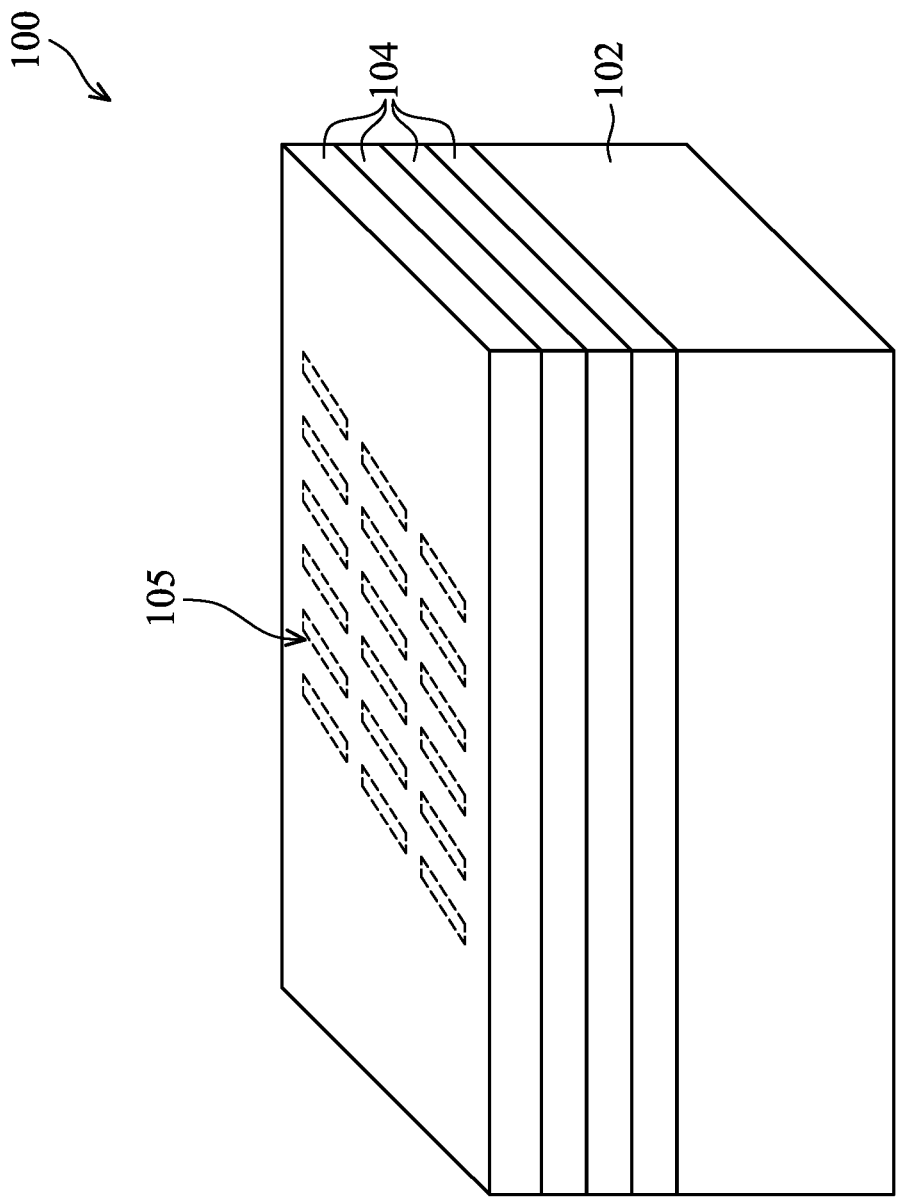
FIG. 1 is a perspective view of a semiconductor structure having metal tracks designed according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

This application generally relates to semiconductor structures and fabrication processes, and more particularly to metal tracks for advanced semiconductor fabrication.

Technology competitiveness in semiconductor manufacturing is built on four closely-related key parameters—performance, power, area, and cost. Semiconductor manufactures sometimes trade one parameter for another in their fabrication processes in order to meet an ever-increasing demand for smaller and faster electronic devices that are simultaneously able to support a greater number of increasingly complex and sophisticated functions. For example, in designing metal tracks (or metallic tracks or metal lines) in multi-level interconnect, some approaches focus on directly shrinking the metal pitch (the interval at which the metal tracks repeat along their widthwise direction) in order to meet the area budget. However, small metal pitches make it difficult for photolithography processes, and thus require double patterning or multi-patterning processes. Consequently, such approaches typically increase process complexity and process costs.

In the present disclosure, the scaling of metal tracks takes on a different dimension. Instead of shrinking the metal pitch and metal width along the widthwise direction of the metal tracks, embodiments of the present disclosure shrink the length of the metal tracks and increase the metal pitch, compared to the approaches that require double patterning or multiple patterning. By shrinking the length of the metal tracks, more metal tracks can be arranged within the geometry of a standard cell along the lengthwise direction of the metal tracks. Thus, the present disclosure still provides sufficient metal tracks for routing standard cells, such as AND, NAND, OR, NOR, Inverter, etc. that provide building blocks for an IC. Further, because the metal pitch is larger than the other approaches, the present disclosure can be implemented using single patterning (or single exposure) photolithography process and does not require double patterning or multiple patterning, thereby reducing the process complexity and costs. Furthermore, the metal tracks of the present disclosure can be made wider than those in other approaches (for the same sized standard cells), thereby reducing resistance and IR drop, increasing the performance of the semiconductor device, and increasing process margin for via landing.

FIG. 1 shows a perspective view of a semiconductor structure 100 (e.g., an integrated circuit 100) constructed according to various aspects of the present disclosure. Referring to FIG. 1, the semiconductor structure 100 includes a substrate 102 and wiring layers 104 formed over the substrate 102. The wiring layers 104 include metal tracks (or metal lines) 105 (indicated by the phantom lines) and vias (not shown in FIG. 1 but shown in FIGS. 2-4 as vias 106). In an embodiment, the metal tracks 105 form an array with rows and columns. The various metal tracks 105 and vias 106 form an interconnect structure that connect active (e.g., transistors) and/or passive (e.g., resistors) devices in the semiconductor structure 100. It is noted that, in various embodiments, the semiconductor structure 100 may include any number of wiring layers 104, such as four, five, six, seven, or even more wiring layers.

In embodiments, the substrate 102 includes a silicon substrate (e.g., a wafer). Alternatively, the substrate 102 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 102 is a semiconductor on insulator (SOI). The substrate 102 includes active devices such as p-type field effect transistors (PFET), n-type FET (NFET), metal-oxide semiconductor field effect transistors (MOSFET), p-type MOSFET (PMOSFET), n-type MOSFET (NMOSFET), complementary MOSFET (CMOSFET), bipolar transistors, high voltage transistors, and high frequency transistors. The transistors may be planar transistors or multi-gate transistors such as FinFETs and gate-all-around (GAA) transistors. The substrate 102 may further include passive devices such as resistors, capacitors, and inductors.

The wiring layers 104 include dielectric materials in which the metal tracks 105 and the vias 106 are embedded. In embodiments, the dielectric materials may include a low-k dielectric material such as oxide formed with tetraethylorthosilicate (TEOS), un-doped silicate glass, or doped silicon oxide such as borophosphosilicate glass (BPSG), fluorosilicate glass (FSG), phosphosilicate glass (PSG), boron doped silicon glass (BSG), and/or other suitable dielectric materials. In embodiments, the metal tracks 105 may each include an electrically conductive metal-diffusion barrier layer as an outer layer and a metal conductor as an inner layer. For example, the metal-diffusion barrier layer may comprise tantalum (Ta) or tantalum nitride (TaN), and the metal conductor may comprise copper (Cu), aluminum (Al), tungsten (W), cobalt (Co), silver (Ag), gold (Au), and other suitable metals. Similarly, the vias 106 may each include a metal-diffusion barrier layer as an outer layer and a metal plug as an inner layer.

Figure 2:
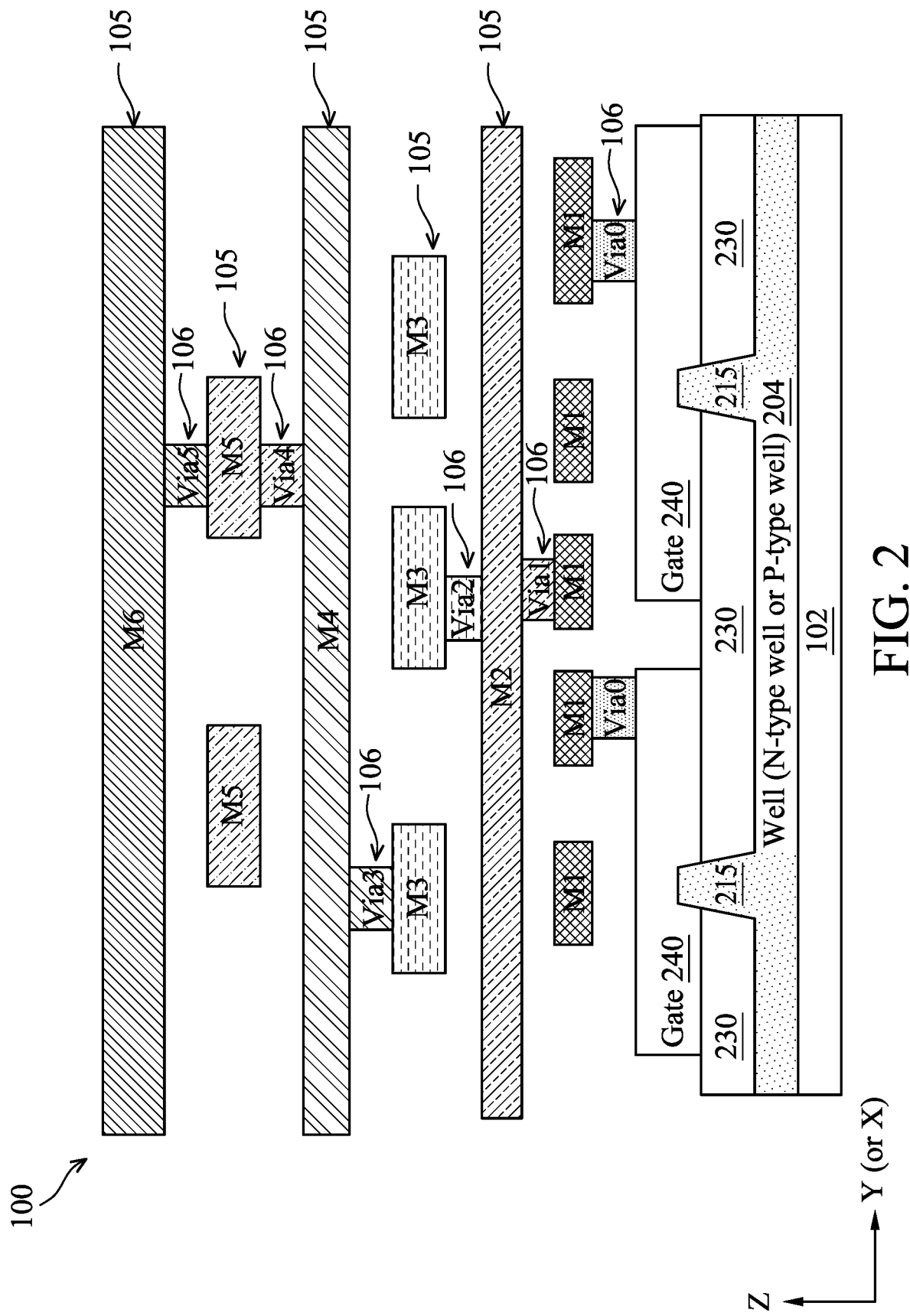
FIG. 2 shows a cross-sectional view of various layers of the semiconductor structure shown in FIG. 1, according to an embodiment of the present disclosure.

FIG. 2 shows a cross-sectional view of the semiconductor structure 100, illustrating various layers therein including the substrate 102, wells (or diffusion layer) 204, isolation structure 230, active regions (e.g., semiconductor fins) 215, gate structures 240, via0 layer, the first through sixth metal layers (M1, M2, M3, M4, M5, and M6), and the first through fifth via layers (via1, via2, via3, via4, and via5). The semiconductor structure 100 may include other layers or structures not shown in FIG. 2, such as the dielectric layers where the vias and metal layers are embedded. The metal tracks 105 shown in FIG. 1 represent metal tracks in any one of the metal layers M1, M2, M3, M4, M5, and M6. Further, any one of the metal layers M1, M2, M3, M4, M5, and M6 is connected to adjacent (below or above) metal layers or transistor terminals (such as gate, source, drain) through a via layer having vias 106.

The wells 204 are formed in or on the substrate 102. The wells 204 include p-type doped regions configured for n-type transistors, and n-type doped regions configured for p-type transistors. The active regions 215 include fin-shaped semiconductor material(s) (or fins) protruding from the substrate 102 in the depicted embodiment. In alternative embodiments, the active regions 215 may include planar semiconductor regions for planar transistors or stacked channel layers for gate-all-around transistors. In an embodiment, the active regions 215 for NMOSFET include single crystalline silicon or intrinsic silicon or another suitable semiconductor material; and the active regions 215 for PMOSFET may comprise silicon, germanium, silicon germanium, or another suitable semiconductor material. The isolation structure 230 isolates the active regions 215. The isolation structure 230 may include silicon oxide, silicon nitride, silicon oxynitride, other suitable isolation material (for example, including silicon, oxygen, nitrogen, carbon, or other suitable isolation materials), or combinations thereof. Isolation structure 230 may include different structures, such as shallow trench isolation (STI) structures and/or deep trench isolation (DTI) structures.

The gate structures 240 include gate dielectric layer(s) and gate electrode layer(s). The gate dielectric layer(s) may include silicon dioxide, silicon oxynitride, and/or a high-k dielectric material such as $HfO_2$, HfSiO, $HfSiO_4$, HfSiON, HfLaO, HfTaO, HfTiO, HfZrO, HfAlOx, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide ($k \approx 3.9$). The gate electrode layer(s) may include titanium, aluminum, tantalum carbide, tantalum carbide nitride, tantalum silicon nitride, titanium nitride, tantalum nitride, ruthenium, molybdenum, tungsten, platinum, tungsten, cobalt, copper, and/or other suitable materials.

Each of the via layers (via0 through via5 in FIG. 2) and the metal layers (M1 through M6 in FIG. 2) may include titanium, tantalum, tungsten, cobalt, molybdenum, ruthenium, or a conductive nitride such as titanium nitride, titanium aluminum nitride, tungsten nitride, tantalum nitride, or combinations thereof.

In an embodiment, a metal layer and a via layer directly under the metal layer are formed by a dual damascene process. Taking the M2 layer and the Via1 layer for example, after a stack of dielectric layers are formed over the M1 layer, a process may be used to etch an upper dielectric layer in the stack to form trenches that correspond to the metal tracks 105 in the M2 layer. Then another process may be used to further etch other dielectric layers in the stack and within the trenches to form holes that correspond to the vias 106 in the Via1 layer. Then, one or more metal layers are filled into the holes and the trenches to form the vias 106 and metal tracks 105 simultaneously. Subsequently, a chemical mechanical planarization process is used to remove excess metals and to planarize the dielectric layer and the metal layer. This process repeats for each metal layer and the via layer directly under the respective metal layer.

In various embodiments of the semiconductor structure 100, there may be many metal layers and via layers. Thus, it is desirable to optimize the metal layers in view of a few key metrics. One of the key metrics is the size of the metal tracks 105, such as the thickness, width, and length of the metal tracks 105, which affects the power consumption, parasitic capacitance, and IR drop. Another key metrics is the density of the metal tracks 105, i.e., the number of metal tracks 105 per unit area. It is generally desirable to have as many metal tracks 105 per unit area as possible so as to provide sufficient routing for the underlying devices (such as transistors). Yet another key metric is the manufacturing complexity and costs.

Some approaches focus on directly shrinking the metal pitch (the interval at which the metal tracks 105 repeat along their widthwise direction) in order to increase the density of the metal tracks. However, small metal pitches may make it difficult for photolithography processes. For example, any photolithography process has certain resolution limit determined in part by the wavelength of the light used for the photolithography. The minimum feature size that a projection system in a photolithography process can print is given approximately by:

$$CD = k_1 * \frac{\lambda}{NA} \quad \text{(Equation 1)}$$

where CD is the minimum feature size (also called the critical dimension), $k_1$ is a coefficient that encapsulates process-related factors, $\lambda$ is the wavelength of light used, and NA is numerical aperture of the lens as seen from the wafer. When the metal pitches are smaller than the resolution limit (e.g., the CD) of a given photolithography process, the metal tracks can no longer be reliably printed in a single photo exposure, thus requiring double patterning or multiple patterning processes. A double patterning process divides the mask patterns corresponding to the metal tracks into two subsets and prints the two subsets onto a wafer using two separate photolithography processes. Similarly, a multiple patterning process prints the mask patterns corresponding to the metal tracks using two or more photolithography processes. Thus, a double patterning process or a multiple patterning process typically adds manufacturing complexity and costs compared to a single patterning process.

Instead of reducing the pitch and the width of the metal tracks, embodiments of the present disclosure reduce the length of the metal tracks while keeping the pitch of the metal tracks equal to or greater than the resolution limit of the photolithography process selected for manufacturing the semiconductor structure 100. In other words, the metal tracks of the present disclosure can be manufactured using a single patterning (single exposure) process, thereby reducing the manufacturing complexity and costs. Embodiments of the present disclosure can produce metal tracks in high density without incurring manufacturing complexity and costs as required by double patterning or multiple patterning processes.

Figure 3:
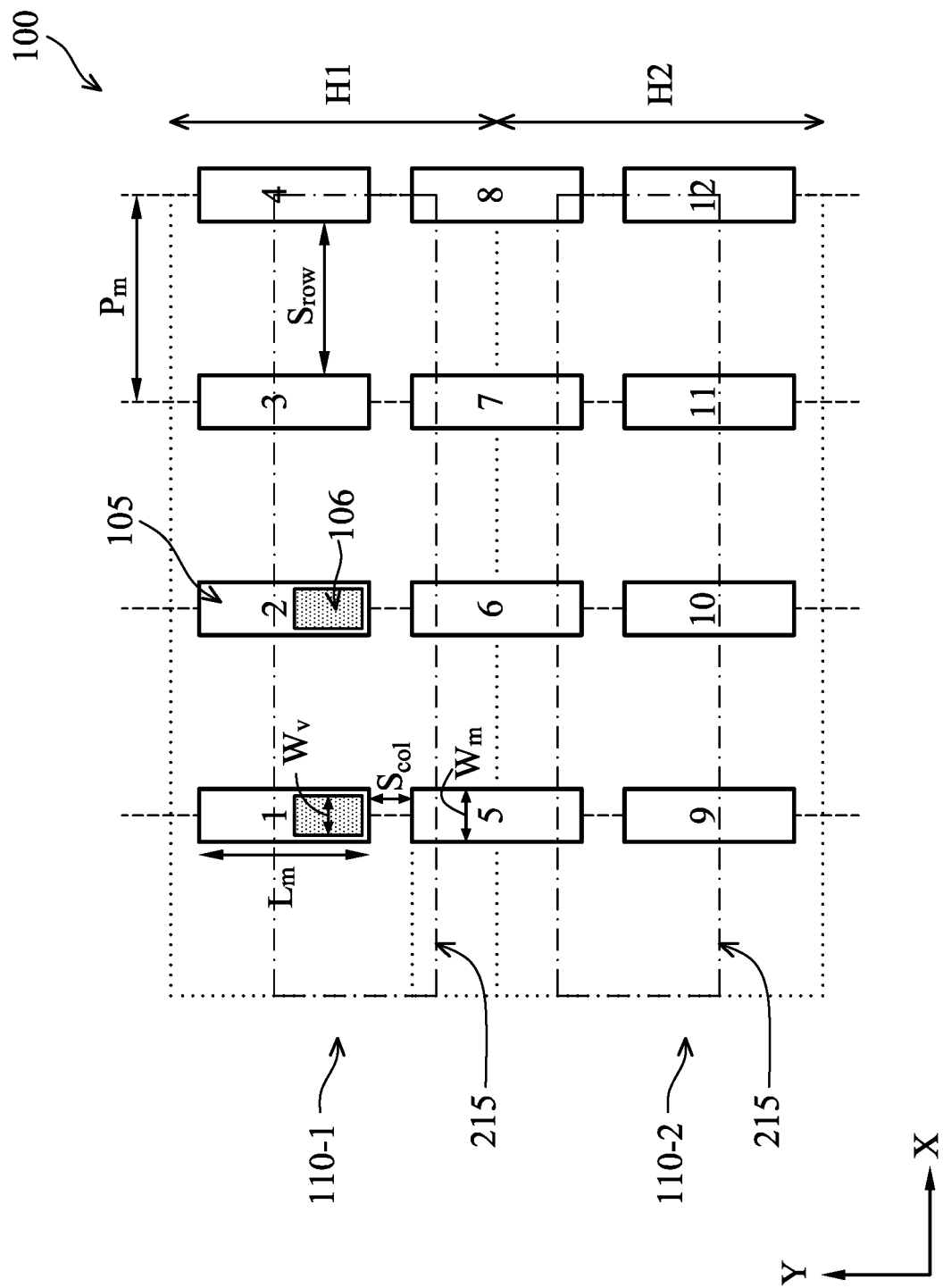
FIGS. 3, 4, 5, 6, 7, 8, and 9 are top plan views of the metal tracks in the semiconductor structure in FIG. 1 according to various embodiments of the present disclosure.

Referring to FIG. 3, shown therein is a top plan view of an array of metal tracks 105 designed according to an embodiment of the present disclosure. The metal tracks 105 are disposed above a plurality of unit cells 110 with two unit cells 110-1 and 110-2 shown as dotted boxes. Along the Y direction, the unit cell 110-1 has a height H1, and the unit cell 110-2 has a height H2. In the present embodiment, H1 equals to H2. In alternative embodiments, H1 may be smaller than or greater than H2. The unit cells 110-1 and 110-2 share a common cell boundary. In the embodiment depicted in FIG. 3, the unit cells 110-1 and 110-2 have the same width along the X direction. There may be many such unit cells 110 arranged in columns (along the Y direction) and rows (along the X direction) in the semiconductor structure 100. Each of the unit cells 110 may include one or more standard logic cells such as AND, NOR, OR, NAND, inverter, and so on. The height H1 is sufficiently large such that the unit cell 110-1 includes one or more NMOSFETs, one or more PMOSFETs, or one or more CMOSFETs. Similarly, the height H2 is sufficiently large such that the unit cell 110-2 includes one or more NMOSFETs, one or more PMOSFETs, or one or more CMOSFETs. For example, each of the unit cells 110-1 and 110-2 includes at least one semiconductor active region 215 (see also FIG. 2) upon which an NMOSFET, a PMOSFET, or a CMOSFET is built on. The at least one semiconductor active region 215 extends lengthwise along the X direction and has a width along the Y direction, which width is smaller than the respective height H1 and H2. In an embodiment, the height H1 is less than 250 nm, the height H2 is less than 250 nm, and a pitch of the active regions 215 is about 25 nm. In such embodiment, there may be up to 10 active regions 215 in each of the cells 110-1 and 110-2.

The metal tracks 105 are arranged in an array with columns (along the Y direction) and rows (along the X direction). Each metal track 105 extends lengthwise along the Y direction and widthwise along the X direction. It is noted that the X and Y directions illustrated in FIG. 3 are merely for ease of description and may represent any two orthogonal directions. It is further noted that the metal tracks 105 illustrated in FIG. 3 may be in any one of the metal layers in the semiconductor structure 100 (such as M1 through M6 layers) and that metal tracks 105 in an immediately above or below metal layer may extend lengthwise along the X direction and widthwise along the Y direction.

In the embodiment depicted in FIG. 3, all metal tracks 105 in the array have the same length (or height) $L_m$ along the Y direction and the same width $W_m$ along the X direction. Further, the length $L_m$ is less than the height H1 and is less than the height H2. Along the X direction (the row direction), the metal tracks 105 are spaced by a row spacing (or edge-to-edge spacing) $S_{row}$ between two adjacent edges. Further, along the X direction, the metal tracks 105 are spaced by a pitch $P_m$. FIG. 3 illustrates the pitch $P_m$ as a centerline-to-centerline distance of the metal tracks 105. In an alternative embodiment, the pitch $P_m$ is an edge-to-edge distance of the metal tracks 105. Along the Y direction (the column direction), the metal tracks 105 are spaced by a column spacing (or end-to-end spacing) $S_{col}$ between two adjacent ends.

In this embodiment, the array of metal tracks 105 are manufactured or to be manufactured using a single exposure photolithography process. The photolithography process has a half-pitch resolution $R_x$ (or $R_{row}$) along the X direction and a half-pitch resolution $R_y$ (or $R_{col}$) along the Y direction. For example, $R_{row}$ may be in a range of about 5 nm to about 30 nm, and $R_{col}$ may be in a range of about 5 nm to about 30 nm. In this embodiment, the width $W_m$ is equal to or greater than $R_{row}$, and the spacing $S_{row}$ is equal to or greater than $R_{row}$. Thus, the pitch $P_m$ is equal to or greater than $2R_{row}$. For example, the pitch $P_m$ is about 2.0 to 2.5 times of $R_{row}$. In some embodiments, it is desirable to design the pitch $P_m$ as small as possible while providing sufficient process margin for a photolithography process that is used to form patterns corresponding to all the metal tracks 105 in a single exposure.

Further, the spacing $S_{col}$ is equal to or greater than $R_{col}$, and the length $L_m$ is equal to or greater than $R_{col}$. Furthermore, in an embodiment, the length $L_m$ is designed to be about 0.45 to 0.95 times, such as about 0.7 times, of the pitch $P_m$. Such length allows a large number of metal tracks 105 per an average cell area.

In an embodiment, the sum of the length $L_m$ and spacing $S_{col}$ is designed to be less than or equal to two thirds (⅔) of the average cell height $H_{avg}=(H1+H2)/2$. For example, the sum of the length $L_m$ and spacing $S_{col}$ is designed to be about one half (½) to two thirds (⅔) of the average cell height $H_{avg}=(H1+H2)/2$. In other words:

$$L_m + S_{col} = a * H_{avg}, \text{ where } a \text{ is about 0.5 to 0.667.} \quad \text{(Equation 2)}$$

Since H1 is equal to H2 in this embodiment, the average cell height $H_{avg}$ is equal to H1. In an embodiment, the average cell height $H_{avg}$ is less than 250 nm or is less than 10 times the pitches of the active regions 215. Equation 2 also applies in embodiments where there are more than two unit cells 110. In those embodiments, the average cell height $H_{avg} = \Sigma_{i=1}^{N} H_i/N$. The length and spacing shown in Equation 2 allow a large number of metal tracks 105 to be packed per an average cell area, providing sufficient metal track density for routing the cells 110.

In the embodiment shown in FIG. 3, there are three rows of the metal tracks 105 in an area that is directly above the two unit cells 110-1 and 110-2 and has a height that equals to H1+H2. This area is also referred to as a double-height area. There are four metal tracks 105 in each row in this embodiment. Further, one row of the metal tracks 105 extend across the common boundary between the units 110-1 and 110-2. In alternative embodiments (such as in FIG. 8), there may be four rows of the metal tracks 105 in a double-height area.

In the embodiment depicted in FIG. 3, since the pitch $P_m$ is equal to or greater than $2R_{row}$, the metal tracks 105 can be manufactured using a single patterning (i.e., a single exposure) process, thereby reducing the manufacturing complexity and costs. Mask patterns corresponding to the array of the metal tracks 105 in FIG. 3 are contained (or included) in a single photomask used by the photolithography process. Further, since the metal tracks 105 are designed to be shorter than the average cell height (see Equation 2 above), many metal tracks 105 can be packed per unit cell. For example, three or more rows of metal tracks 105 can be placed in a double-height area.

FIG. 3 further depicts example vias 106 that are connected to some of the metal tracks 105. The vias 106 reside in a via layer that is immediately below or above the metal layer where the metal tracks 105 reside. Some vias 106 have a width $W_v$ which is equal to or smaller than the metal width $W_m$. The pitch of the vias 106 is equal to or greater than the metal pitch $P_m$. Thus, the vias 106 can also be manufactured using a single patterning process.

FIG. 3 (as well as each of FIGS. 4-9) can be viewed as depicting the metal tracks 105 in the semiconductor structure 100 that has been manufactured. FIG. 3 (as well as each of FIGS. 4-9) can also be viewed as depicting a layout of the semiconductor structure 100 to be manufactured. In such case, the metal tracks 105 (as well as other structures in those figures) are the patterns (or layout patterns) in the layout. The layout patterns are converted to mask patterns in a photomask through a mask-making process. Then, through various manufacturing processes (such as photolithography, etching, and deposition), the mask patterns are transferred to a wafer, thereby forming the metal tracks 105 in the semiconductor structure 100.

Figure 4:
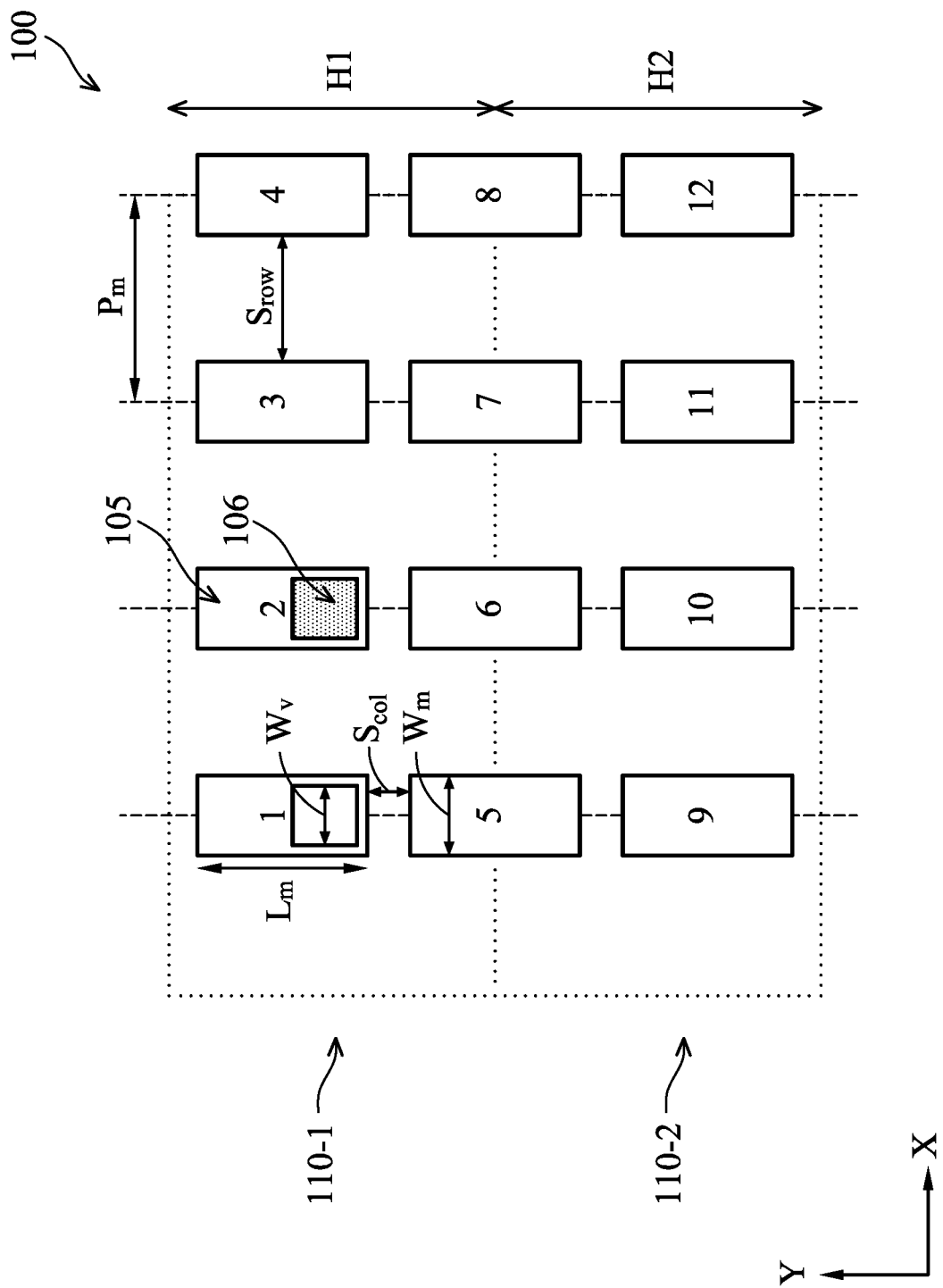

FIG. 4 shows a top plan view of an array of metal tracks 105 designed according to another embodiment of the present disclosure. In FIG. 3, as both the width $W_m$ and the spacing $S_{row}$ are equal to or greater than $R_{row}$, the width $W_m$ will be close to about 0.4 to 0.6 times of the pitch $P_m$. In FIG. 4, the width $W_m$ of the metal tracks 105 is designed to be about 0.55 to about 0.75 times, such as about 0.65 times, of the pitch $P_m$. In such condition, the width $W_m$ is wider than that in FIG. 3, allowing the width $W_v$ to size-up equally to gain the circuit performance or provide extra process margin for via landing. Other aspects of the embodiment in FIG. 4 are the same as those of the embodiment in FIG. 3.

Figure 5:
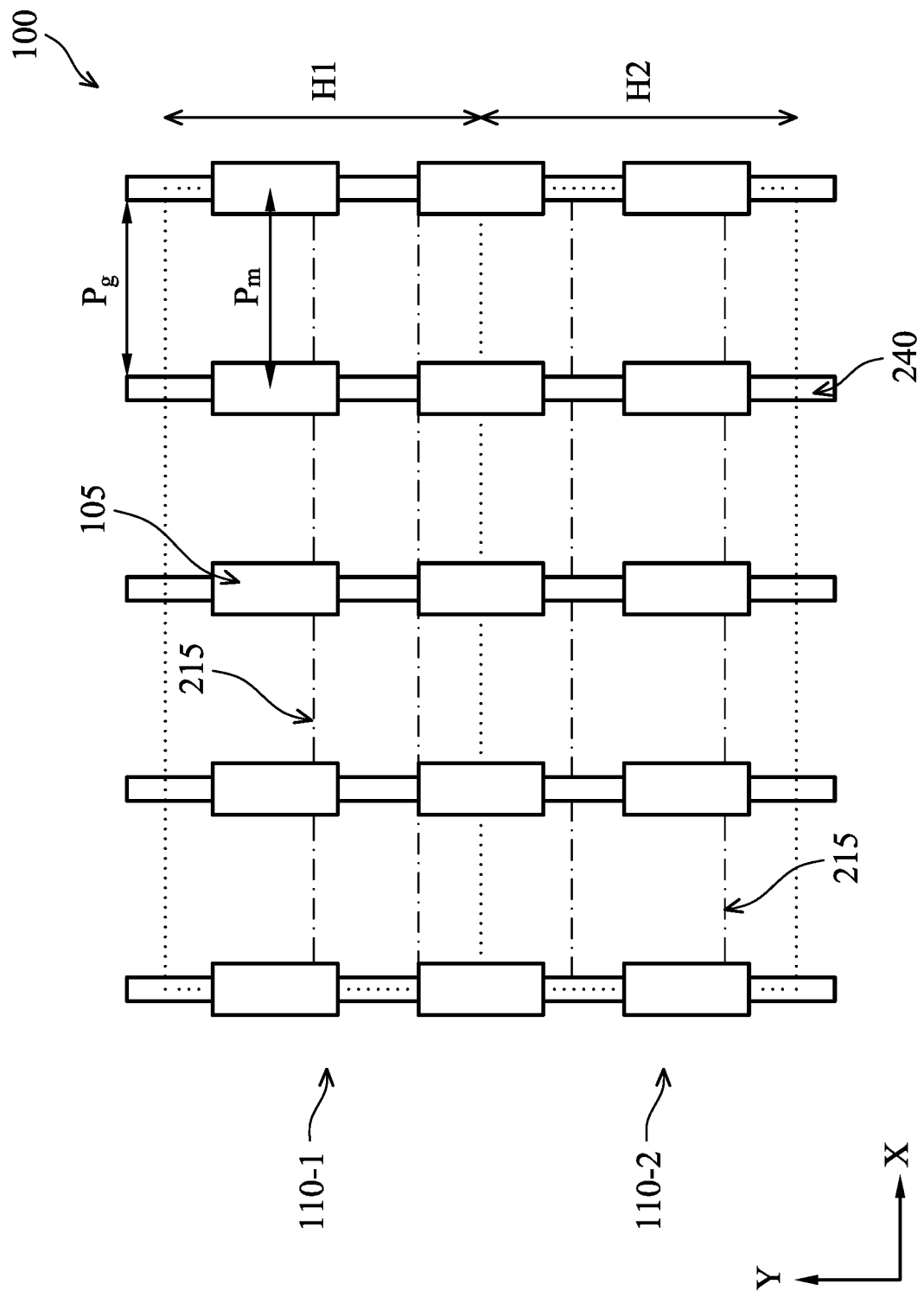

FIG. 5 further depicts gate structures 240 (or gates 240 or gate lines 240) in addition to the metal tracks 105 and the cells 110. The gate structures 240 extend lengthwise along the Y direction in this embodiment. Some of the gate structures 240 engage the active regions 215 to form NMOSFETs, PMOSFETs, or CMOSFETs. The gate structures 240 are spaced from each other along the X direction by a pitch $P_g$. In an embodiment, the pitch $P_g$ is about 60 nm or less, such as in a range from 10 nm to 60 nm.

In this embodiment, the pitch $P_g$ is substantially equal to the pitch $P_m$. Further, each column of the metal tracks 105 is disposed directly above a gate structure 240 from the top view. In another embodiment (not shown), each column of the metal tracks 105 is disposed not directly above, but offset from, a gate structure 240 from the top view. However, in both embodiments, the number of columns of the metal tracks 105 and the number of gate structures 240 are the same within the cell 110-1 (or the cell 110-2). Other aspects of the embodiment in FIG. 5 are the same as those of the embodiment in FIG. 3.

Figure 6:
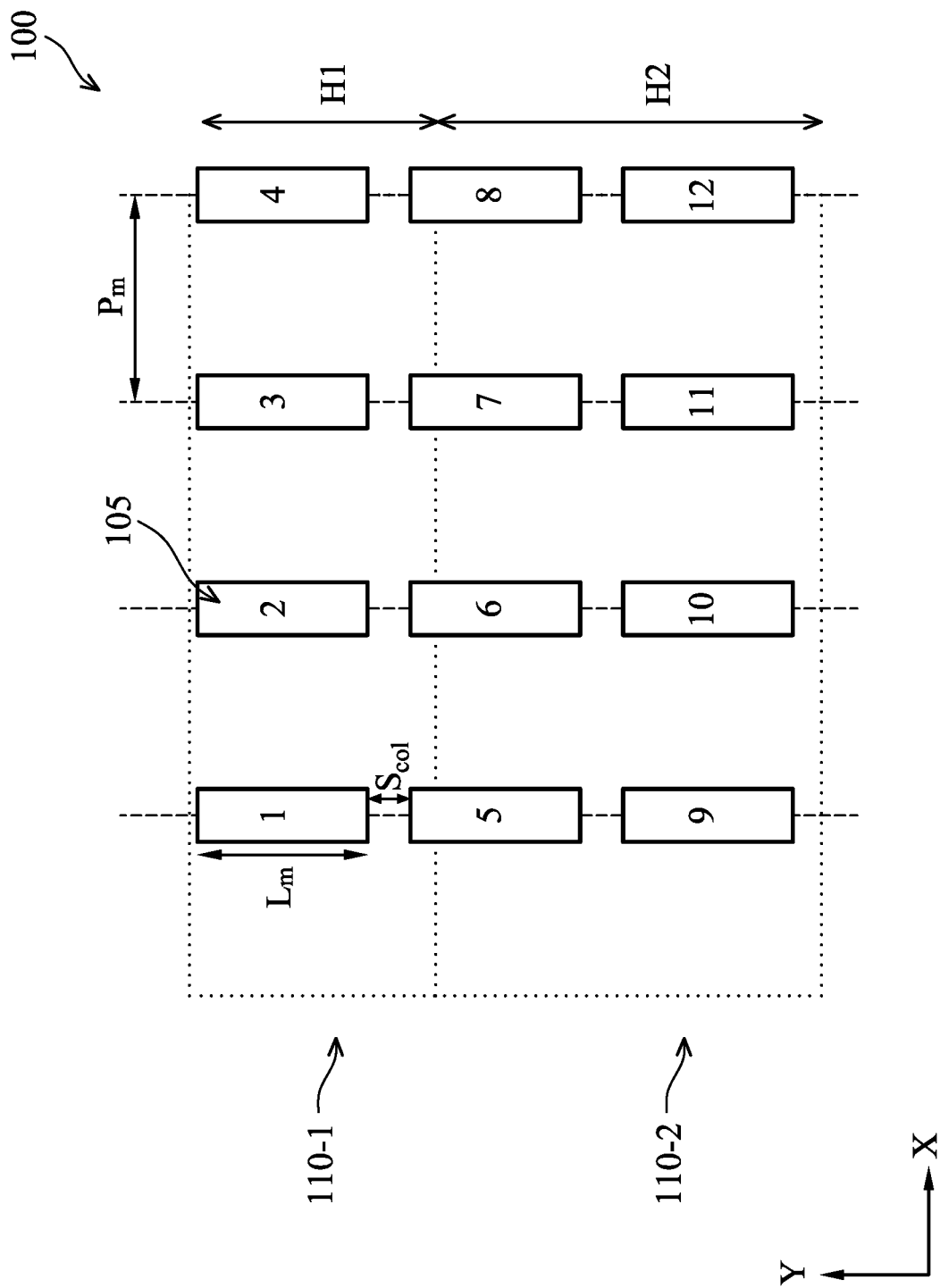

FIG. 6 shows a top plan view of an array of metal tracks 105 designed according to another embodiment of the present disclosure. In this embodiment, the height H1 is less than the height H2 and is greater than the length $L_m$ of the metal tracks 105. Other aspects of the embodiment in FIG. 6 are the same as those of the embodiment in FIG. 3. For example, all the metal tracks 105 have the same length $L_m$ and there are three rows of the metal tracks 105 in an area that is directly above the two unit cells 110-1 and 110-2 and has a height that equals to H1+H2. Further, the second row of the metal tracks 105 (from the top) extend across the boundary between the two cells 110-1 and 110-2. Further, the sum of the length $L_m$ and spacing $S_{col}$ is designed to be less than or equal to two thirds (⅔) of the average cell height $H_{avg}=(H1+H2)/2$. For example, the sum of the length $L_m$ and spacing $S_{col}$ is designed to be about one half (½) to two thirds (⅔) of the average cell height $H_{avg}=(H1+H2)/2$. In an embodiment, the average cell height $H_{avg}$ is less than 250 nm or less than 10 times the pitches of the active regions 215 (not shown in FIG. 6, but see FIGS. 3, 5, 7). Still further, the pitch $P_m$ is equal to or greater than $2R_{row}$.

Figure 7:
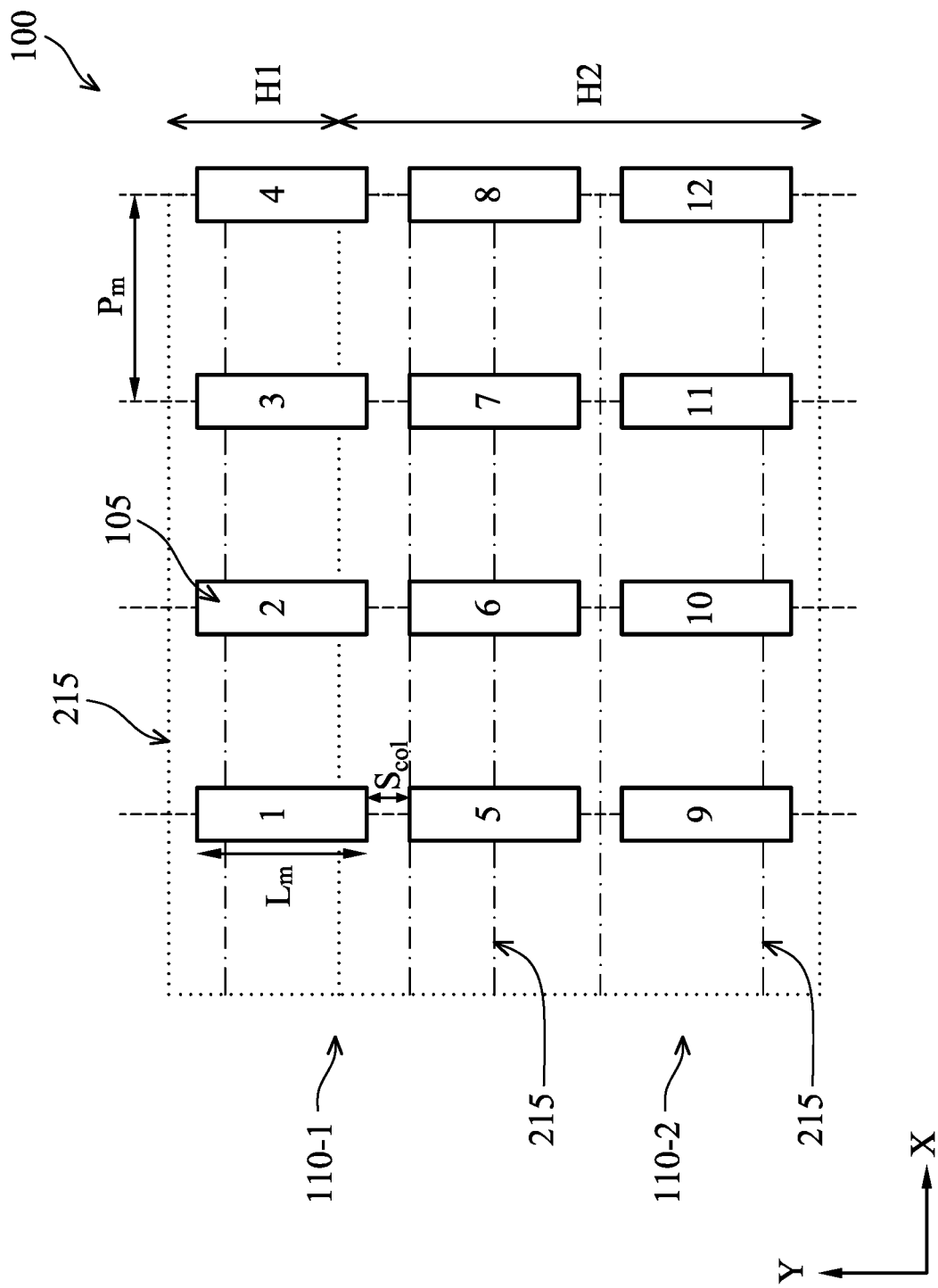

FIG. 7 shows a top plan view of an array of metal tracks 105 designed according to another embodiment of the present disclosure. In this embodiment, the height H1 is less than the height H2 and is less than the length $L_m$ of the metal tracks 105. Since the length $L_m$ is greater than the height H1, the first row of metal tracks 105 extends past the boundary between the two cells 110-1 and 110-2. Such configuration improves the sharing of the metal tracks 105 between the cells 110. Other aspects of the embodiment in FIG. 7 are the same as those of the embodiment in FIG. 3. For example, all the metal tracks 105 have the same length $L_m$ and there are three rows of the metal tracks 105 in an area that is directly above the two unit cells 110-1 and 110-2 and has a height that equals to H1+H2. Further, the sum of the length $L_m$ and spacing $S_{col}$ is designed to be less than or equal to two thirds (⅔) of the average cell height $H_{avg}$=(H1+H2)/2. For example, the sum of the length $L_m$ and spacing $S_{col}$ is designed to be about one half (½) to two thirds (⅔) of the average cell height $H_{avg}$=(H1+H2)/2. In an embodiment, the average cell height $H_{avg}$ is less than 250 nm or less than 10 times the pitches of the active regions 215. Still further, the pitch $P_m$ is equal to or greater than $2R_{row}$.

Figure 8:
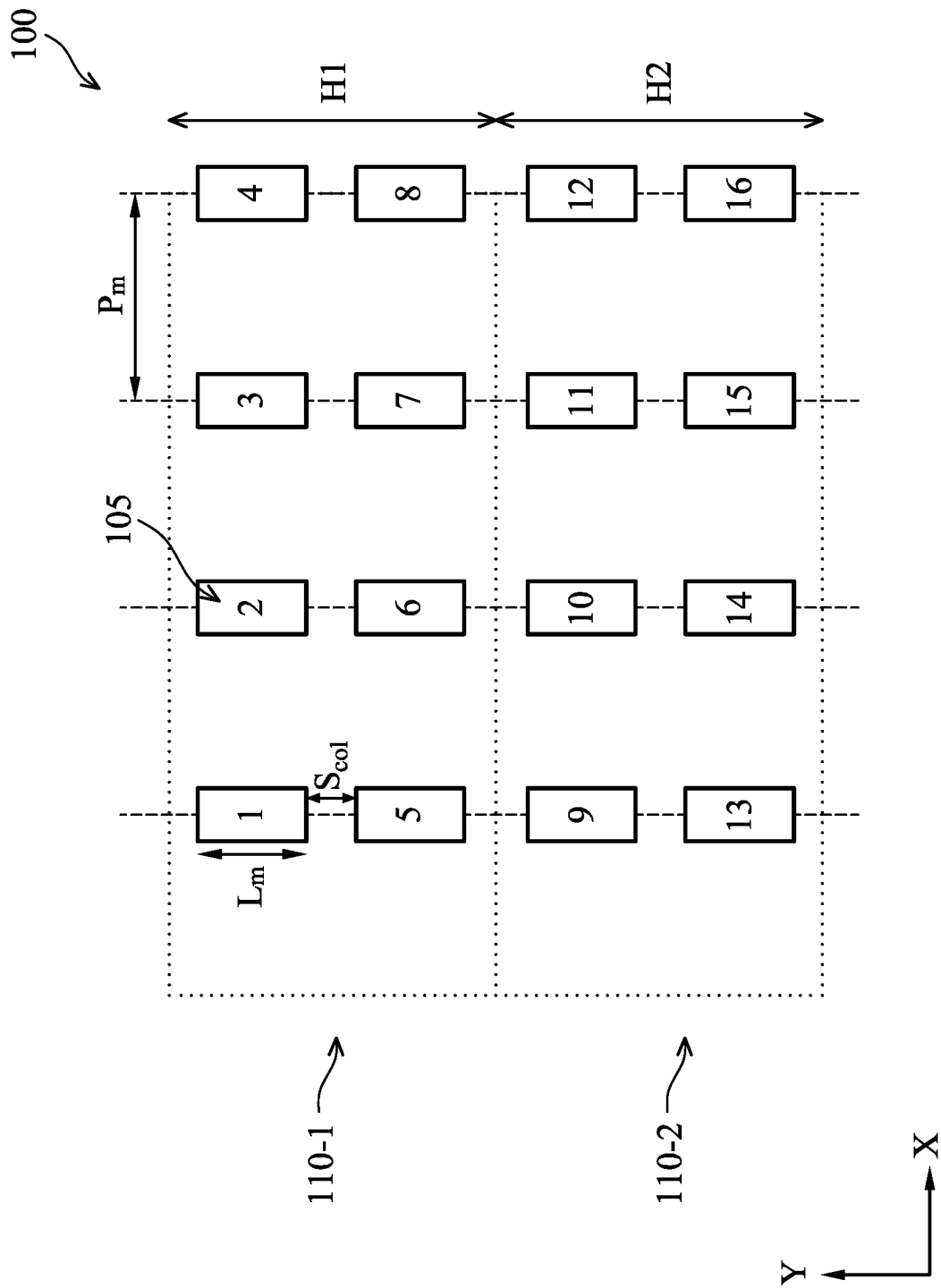

FIG. 8 shows a top plan view of an array of metal tracks 105 designed according to another embodiment of the present disclosure. In this embodiment, all the metal tracks 105 have the same length $L_m$, which is less than the height H1 and is less than the height H2. Further, the sum of the length $L_m$ and spacing $S_{col}$ is designed to be about one half (½) of the average cell height $H_{avg}$=(H1+H2)/2. In an embodiment, the average cell height $H_{avg}$ is less than 250 nm or less than 10 times the pitches of the active regions 215 (not shown in FIG. 8, but see FIGS. 3, 5, 7). There are four rows of the metal tracks 105 in the double-height area in this embodiment. When the height H1 and the height H2 are about the same, there are two rows of the metal tracks 105 directly above each of the cells 110-1 and 110-2. In an alternative embodiment where the height H1 is less than the height H2, like that in FIG. 6 or FIG. 7, there may be more rows of metal tracks 105 directly above the cell 110-2 than directly above the cell 110-1. Other aspects of the embodiment in FIG. 8 are the same as those of the embodiment in FIG. 3. For example, the pitch $P_m$ is equal to or greater than $2R_{row}$.

Figure 9:
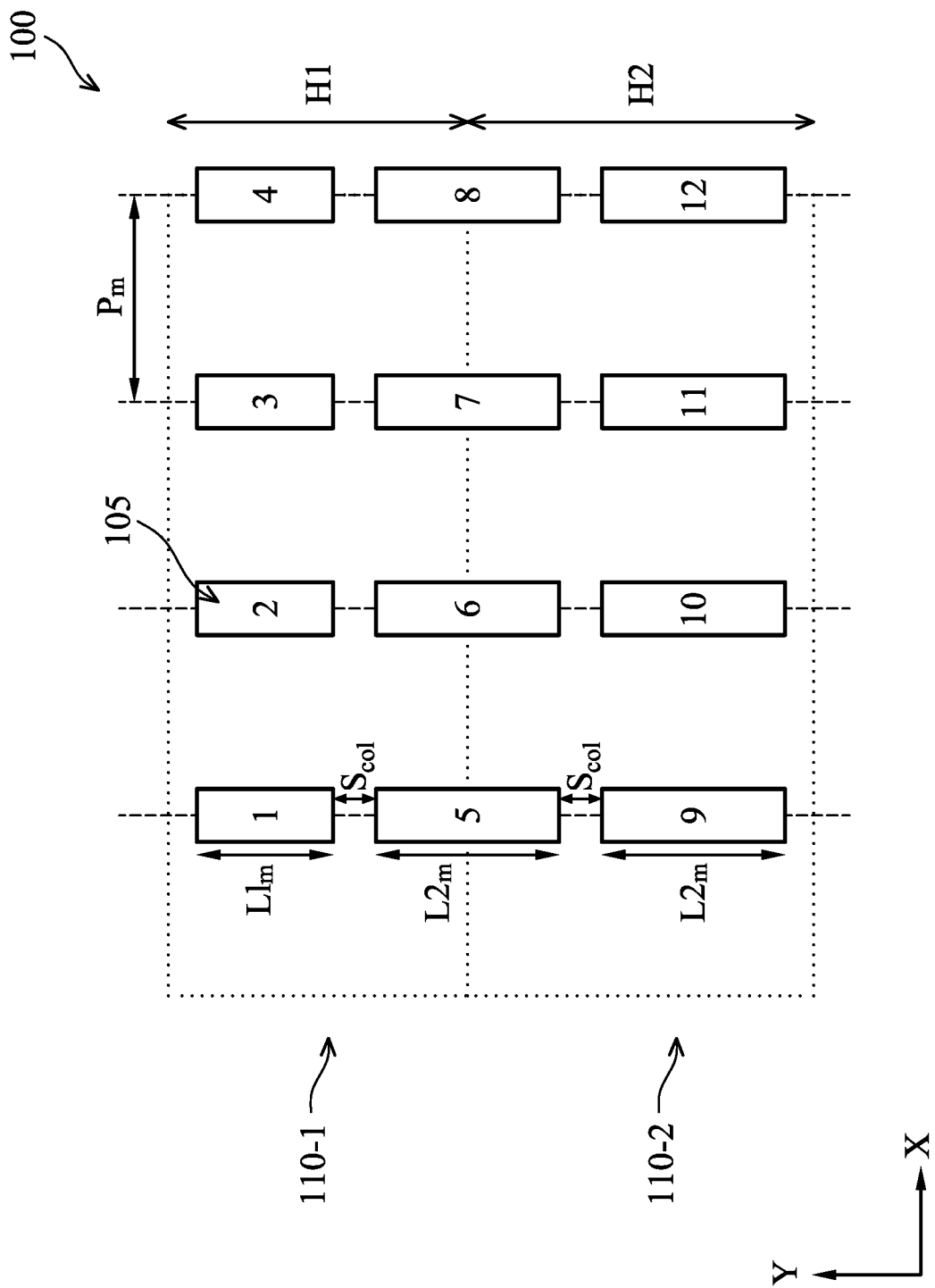

FIG. 9 shows a top plan view of an array of metal tracks 105 designed according to yet another embodiment of the present disclosure. In this embodiment, the height H1 is less than the height H2. There are three rows of metal tracks 105 directly above the area occupied by the two cells 110-1 and 110-2. Not all the metal tracks 105 have the same length. Particularly, metal tracks 105 in the first row (from the top) each has a length $L1_m$, and metal tracks 105 in the other two rows each has a length $L2_m$. The length $L1_m$ is less than the height H1, and the length $L2_m$ is less than the height H2. Further, the sum of the length $L1_m$ and spacing $S_{col}$ is designed to be about one half (½) to two thirds (⅔) of the average cell height $H_{avg}$=(H1+H2)/2, and the sum of the length $L2_m$ and spacing $S_{col}$ is designed to be about one half (½) to two thirds (⅔) of the average cell height $H_{avg}$=(H1+H2)/2. In an embodiment, the average cell height $H_{avg}$ is less than 250 nm or less than 10 times the pitches of the active regions 215 (not shown in FIG. 9, but see FIGS. 3, 5, 7). Still further, in an embodiment, a ratio of H1 to H2 is about the same as a ratio of $L1_m$ to $L2_m$. This embodiment allows the length of the metal tracks 105 to be adjusted based on the height of the cells 110, increasing the design flexibility. Other aspects of the embodiment in FIG. 9 are the same as those of the embodiment in FIG. 3. For example, the middle row of metal tracks 105 extend across the common boundary between the cells 110-1 and 110-2, and the pitch $P_m$ is equal to or greater than $2R_{row}$.

Even though not shown, gate structures 240 may be implemented in each of the embodiment shown in FIGS. 3, 4, 6, 7, 8, and 9, for example, in the same way as implemented in the embodiment shown in FIG. 5. Further, active regions 215 are not shown in FIGS. 4, 6, 8, and 9 for simplicity.

Figure 10:
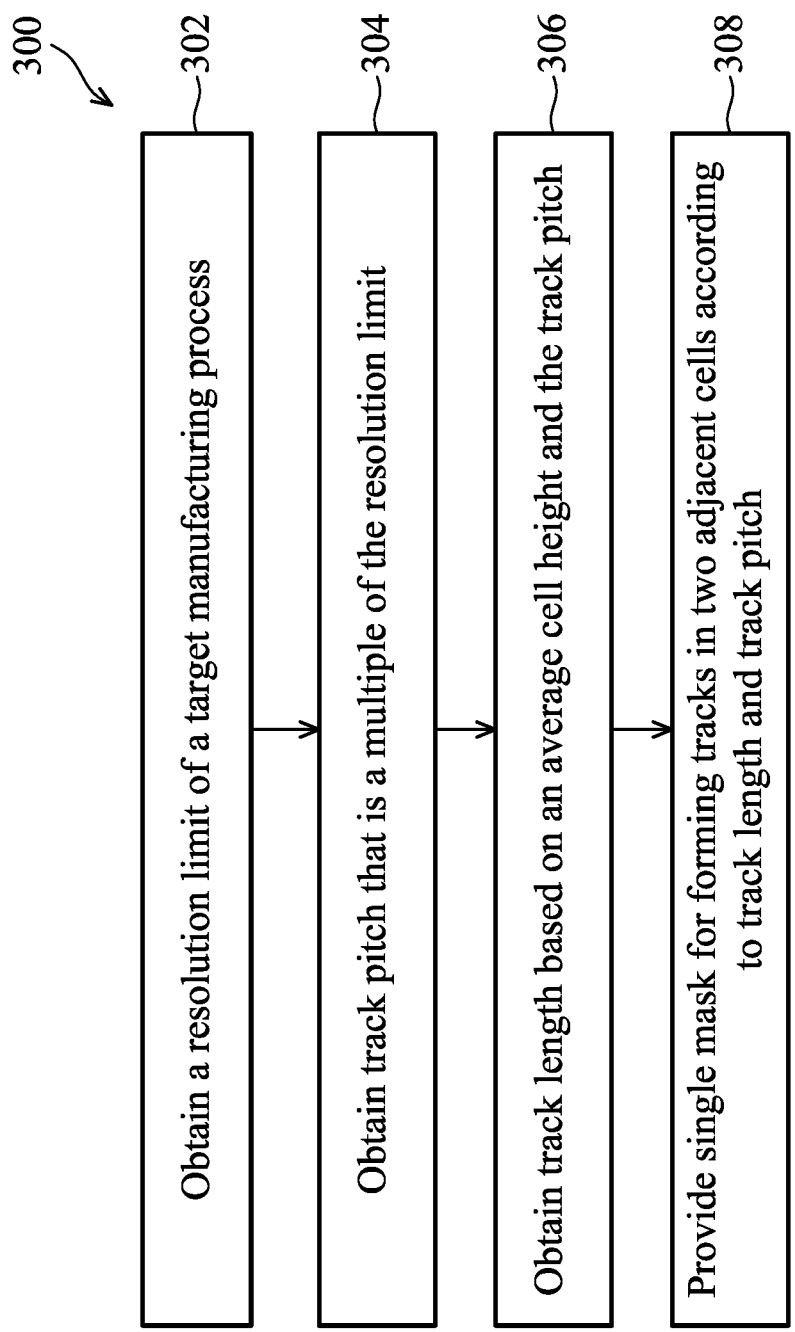
FIG. 10 shows a flow chart of a method according to various embodiments of the present disclosure.

FIG. 10 shows a flow chart of a method 300 for designing and manufacturing the metal tracks 105 according to embodiments of the present disclosure. The method 300 is merely an example and is not intended to limit the present disclosure beyond what is explicitly recited in the claims. Additional operations can be provided before, during, and after the method 300, and some operations described can be replaced, eliminated, or moved around for additional embodiments of the method. The method 300 is described below in conjunction with FIGS. 3-9.

At operation 302, the method 300 (FIG. 10) obtains resolution limits of a target manufacturing process. For example, the resolution limits may include a half-pitch resolution $R_x$ (or $R_{row}$) along the X direction and a half-pitch resolution $R_y$ (or $R_{col}$) along the Y direction in a photolithography process.

At operation 304, the method 300 (FIG. 10) obtains a track pitch $P_m$ for the metal tracks 105. For example, the pitch $P_m$ is equal to or greater than $2R_{row}$ such as about 2.0 to 2.5 times of $R_{row}$.

At operation 306, the method 300 (FIG. 10) obtains a track length (or track height) $L_m$ for the metal tracks 105. In an embodiment, the length $L_m$ is determined according to the track pitch $P_m$ and an average cell height. For example, the length $L_m$ is designed to be about 0.4 to 0.6 times, such as about 0.5 times, of the pitch $P_m$. Also, a sum of the length $L_m$ and an end-to-end spacing $S_{col}$ of the metal tracks 105 is designed to be less than or equal to two thirds (⅔) of the average cell height. For example, the sum of the length $L_m$ and spacing $S_{col}$ is designed to be about one half (½) to two thirds (⅔) of the average cell height $H_{avg}$. The average cell height $H_{avg}$ is the average of the height of the cells underlying the metal tracks 105.

At operation 308, the method 300 (FIG. 10) provides a single mask (or photo mask) that includes mask patterns corresponding to all the metal tracks over at least two adjacent cells. Then, the method 300 performs the target manufacturing process using the mask to form the metal tracks 105 on a wafer.

Although not intended to be limiting, embodiments of the present disclosure provide one or more of the following advantages. For example, embodiments of the present disclosure provide a semiconductor structure with an array of metal tracks. The array of metal tracks may be arranged above standard cells and shared among the standard cells. The length and end-to-end spacing of the metal tracks are scaled based on an average height of the standard cells. Thus, sufficient number of metal tracks can be packed per unit cell area. The pitches of the metal tracks are designed such that all the metal tracks can be formed using a single exposure process, thereby reducing manufacturing complexity and costs. Embodiments of the present disclosure can be readily integrated into existing semiconductor manufacturing processes.

In one example aspect, the present disclosure is directed to a semiconductor structure. The semiconductor structure includes a first cell and a second cell arranged next to each other along a column direction. Each of the first cell and the second cell includes at least one semiconductor active region extending lengthwise along a row direction perpendicular to the column direction. The first cell has a first cell height along the column direction, and the second cell has a second cell height along the column direction. The semiconductor structure further includes an array of metal tracks over the first and the second cells. The array of metal tracks are arranged into rows and columns and are formed by a manufacturing process including a photolithography process having a half-pitch resolution $R_{row}$ in the row direction. A first pitch of the metal tracks along the row direction is greater than or equal to $2R_{row}$. At least three rows of the metal tracks are in an area that is directly above the first and the second cells and has a height that equals to a sum of the first cell height and the second cell height. One of the rows of the metal tracks is disposed across a cell boundary shared by the first and the second cells.

In an embodiment of the semiconductor structure, the first cell height is equal to the second cell height. In another embodiment, the first cell height is less than the second cell height.

In an embodiment, the semiconductor structure further includes gate structures extending lengthwise along the column direction, wherein a second pitch of the gate structures along the row direction is substantially equal to the first pitch.

In an embodiment, the array of metal tracks has a same height along the column direction. In another embodiment, the metal tracks in a same column are spaced by a column spacing, and a sum of a height of any one of the metal tracks and the column spacing is less than or equal to two thirds of an average of the first cell height and the second cell height.

In an embodiment, one of the rows of the metal tracks extend directly over the first cell and has a height greater than the first cell height. In another embodiment, mask patterns corresponding to the array of the metal tracks are included in a single photomask used by the photolithography process. In yet another embodiment, the first and the second cells have a common width along the row direction.

In another example aspect, the present disclosure is directed to a semiconductor structure. The semiconductor structure includes a first cell and a second cell arranged along a column direction and sharing a cell boundary. Each of the first cell and the second cell includes at least one of an NMOSFET, a PMOSFET, and a CMOSFET. The first cell has a first cell height along the column direction. The second cell has a second cell height along the column direction. The semiconductor structure further includes an array of metal tracks over the first and the second cells. The array of metal tracks are arranged into rows and columns and are formed by a manufacturing process that prints patterns corresponding to the array of the metal tracks using a single exposure. At least three rows of the metal tracks are in an area that is directly above the first and the second cells and has a height that equals to a sum of the first cell height and the second cell height.

In an embodiment of the semiconductor structure, one of the rows of the metal tracks is disposed across the cell boundary. In another embodiment, the metal tracks in a same column are spaced by a column spacing, and a sum of a height of any one of the metal tracks and the column spacing is in a range of one half to two thirds of an average of the first cell height and the second cell height.

In an embodiment, the manufacturing process has a half-pitch resolution $R_{row}$ in a row direction perpendicular to the column direction, and a first pitch of the metal tracks along the row direction is in a range of 2.0 to 2.5 times of $R_{row}$. In a further embodiment, the array of metal tracks has a same height along the column direction, and the same height is about half of the first pitch.

In another embodiment, one of the rows of the metal tracks extend directly over the first cell and has a height greater than the first cell height.

In yet another example aspect, the present disclosure is directed to an integrated circuit (IC) layout. The IC layout includes a first cell and a second cell arranged next to each other along a column direction. Each of the first cell and the second cell includes at least one active region extending lengthwise along a row direction perpendicular to the column direction. The first and the second cells have respective first and second cell heights along the column direction. The IC layout further includes an array of metal tracks over the first and the second cells. The array of metal tracks are arranged into rows and columns and are to be formed by a manufacturing process including a photolithography process having a half-pitch resolution $R_{row}$ in the row direction. A first pitch of the metal tracks along the row direction is greater than or equal to $2R_{row}$. The metal tracks in a same column are spaced by a column spacing. A sum of a height of any one of the metal tracks and the column spacing is in a range of one half to two thirds of an average of the first cell height and the second cell height.

In an embodiment of the IC layout, the first pitch is in a range of 2.0 to 2.5 times of $R_{row}$. In another embodiment, one of the rows of the metal tracks extend directly over the first cell and has a height greater than the first cell height.

In an embodiment, the photolithography process has a half-pitch resolution $R_{col}$ along the column direction, and the column spacing is greater than $R_{col}$. In another embodiment, the IC layout further includes gate lines extending lengthwise along the column direction, wherein a second pitch of the gate lines along the row direction is substantially equal to the first pitch.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a first cell and a second cell arranged next to each other along a column direction, each of the first cell and the second cell including at least one semiconductor active region extending lengthwise along a row direction perpendicular to the column direction and gate structures extending lengthwise along the column direction over channel regions of the at least one semiconductor active region, the first cell having a first cell height along the column direction, the second cell having a second cell height along the column direction; and
   an array of metal tracks over the first and the second cells, wherein the array of metal tracks are disposed above the gate structures and arranged into rows and columns and are formed by a manufacturing process including a photolithography process having a half-pitch resolution $R_{row}$ in the row direction, a first pitch of the metal tracks along the row direction is greater than or equal to $2R_{row}$, at least three rows of the metal tracks are in an area that is directly above the first and the second cells and has a height that equals to a sum of the first cell height and the second cell height, and one of the rows of the metal tracks is disposed across a cell boundary shared by the first and the second cells.

2. The semiconductor structure of claim 1, wherein the first cell height is equal to the second cell height.

3. The semiconductor structure of claim 1, wherein the first cell height is less than the second cell height.

4. The semiconductor structure of claim 1, wherein a second pitch of the gate structures along the row direction is substantially equal to the first pitch.

5. The semiconductor structure of claim 1, wherein the array of metal tracks has a same height along the column direction.

6. The semiconductor structure of claim 1, wherein the metal tracks in a same column are spaced by a column spacing, and a sum of a height of any one of the metal tracks and the column spacing is less than or equal to two thirds of an average of the first cell height and the second cell height.

7. The semiconductor structure of claim 1, wherein one of the rows of the metal tracks extend directly over the first cell and has a height greater than the first cell height.

8. The semiconductor structure of claim 1, wherein mask patterns corresponding to the array of the metal tracks are included in a single photomask used by the photolithography process.

9. The semiconductor structure of claim 1, wherein the first and the second cells have a common width along the row direction.

10. A semiconductor structure, comprising:
a first cell and a second cell arranged along a column direction and sharing a cell boundary, each of the first cell and the second cell including at least one of an NMOSFET, a PMOSFET, and a CMOSFET, each of the NMOSFET, PMOSFET, and CMOSFET includes semiconductor active regions extending lengthwise along a first direction and gate structures over the semiconductor active regions and extending lengthwise along a second direction perpendicular to the first direction, the first cell having a first cell height along the column direction, the second cell having a second cell height along the column direction; and
an array of metal tracks over the first and the second cells and disposed above the gate structures, wherein the array of metal tracks are arranged into rows and columns and are formed by a manufacturing process that prints patterns corresponding to the array of the metal tracks using a single exposure, at least three rows of the metal tracks are in an area that is directly above the first and the second cells and has a height that equals to a sum of the first cell height and the second cell height.

11. The semiconductor structure of claim 10, wherein one of the rows of the metal tracks is disposed across the cell boundary.

12. The semiconductor structure of claim 10, wherein the metal tracks in a same column are spaced by a column spacing, and a sum of a height of any one of the metal tracks and the column spacing is in a range of one half to two thirds of an average of the first cell height and the second cell height.

13. The semiconductor structure of claim 10, wherein the manufacturing process has a half-pitch resolution $R_{row}$ in a row direction perpendicular to the column direction, and a first pitch of the metal tracks along the row direction is in a range of 2.0 to 2.5 times of $R_{row}$.

14. The semiconductor structure of claim 13, wherein the array of metal tracks has a same height along the column direction, and the same height is about half of the first pitch.

15. The semiconductor structure of claim 10, wherein one of the rows of the metal tracks extend directly over the first cell and has a height greater than the first cell height.

16. An integrated circuit layout, comprising:
a first cell and a second cell arranged next to each other along a column direction, each of the first cell and the second cell including at least one active region extending lengthwise along a row direction perpendicular to the column direction and gate lines extending lengthwise along the column direction over channel regions of the at least one active region, the first and the second cells having respective first and second cell heights along the column direction; and
an array of metal tracks over the first and the second cells, wherein the array of metal tracks are disposed above the gate lines and arranged into rows and columns and are to be formed by a manufacturing process including a photolithography process having a half-pitch resolution $R_{row}$ in the row direction, a first pitch of the metal tracks along the row direction is greater than or equal to $2R_{row}$, the metal tracks in a same column are spaced by a column spacing, a sum of a height of any one of the metal tracks and the column spacing is in a range of one half to two thirds of an average of the first cell height and the second cell height.

17. The integrated circuit layout of claim 16, wherein the first pitch is in a range of 2.0 to 2.5 times of $R_{row}$.

18. The integrated circuit layout of claim 16, wherein one of the rows of the metal tracks extend directly over the first cell and has a height greater than the first cell height.

19. The integrated circuit layout of claim 16, wherein the photolithography process has a half-pitch resolution $R_{col}$ along the column direction, and the column spacing is greater than $R_{col}$.

20. The integrated circuit layout of claim 16, wherein a second pitch of the gate lines along the row direction is substantially equal to the first pitch.

* * * * *